(12) United States Patent
Ozaki et al.

(10) Patent No.: US 10,087,513 B2
(45) Date of Patent: Oct. 2, 2018

(54) PISTON RING AND MANUFACTURING METHOD THEREFOR

(71) Applicant: NIPPON PISTON RING CO., LTD, Saitama-shi, Saitama (JP)

(72) Inventors: Takuya Ozaki, Ichinoseki (JP); Hiroyuki Sugiura, Ichinoseki (JP)

(73) Assignee: NIPPON PISTON RING CO., LTD, Saitama-shi, Saitama (JP)

( * ) Notice: Subject to any disclaimer, the term of this patent is extended or adjusted under 35 U.S.C. 154(b) by 151 days.

(21) Appl. No.: 15/104,660

(22) PCT Filed: Jan. 30, 2015

(86) PCT No.: PCT/JP2015/052680
§ 371 (c)(1),
(2) Date: Jun. 15, 2016

(87) PCT Pub. No.: WO2015/115601
PCT Pub. Date: Aug. 6, 2015

(65) Prior Publication Data
US 2017/0002454 A1 Jan. 5, 2017

(30) Foreign Application Priority Data

Jan. 31, 2014 (JP) ................ 2014-016344
Sep. 30, 2014 (JP) ................ 2014-201838

(51) Int. Cl.
*C23C 14/06* (2006.01)
*F16J 9/26* (2006.01)
(Continued)

(52) U.S. Cl.
CPC ........ *C23C 14/0605* (2013.01); *C23C 14/025* (2013.01); *C23C 14/32* (2013.01);
(Continued)

(58) Field of Classification Search
USPC ............ 277/442; 204/192.1, 192.15, 192.16; 428/336, 408, 469, 472
See application file for complete search history.

(56) References Cited

U.S. PATENT DOCUMENTS

2006/0077593 A1* 4/2006 Ueda ............... G11B 5/102
360/235.1
2007/0054125 A1* 3/2007 Akari ............... C23C 14/024
428/408
(Continued)

FOREIGN PATENT DOCUMENTS

JP 2000-128516 A 5/2000
JP 2002-322555 * 11/2002
(Continued)

OTHER PUBLICATIONS

Communication dated Dec. 8, 2016, from the European Patent Office in counterpart European application No. 15744046.2.
(Continued)

*Primary Examiner* — Archene A Turner
(74) *Attorney, Agent, or Firm* — Sughrue Mion, PLLC

(57) ABSTRACT

A piston ring having a hard carbon film formed on at least an external peripheral sliding surface of a piston ring base material, the hard carbon film having an $sp^2$ component ratio within a range of 40% to 80% inclusive as measured by a TEM-EELS spectrum which combines electron energy loss spectroscopy (EELS) with a transmission electron microscope (TEM), a hydrogen content being in a range of 0.1 at. % to 5 at. % inclusive, and an amount of macroparticles appearing on the surface being within a range of 0.1% to 10% inclusive by area ratio. The hard carbon film is formed on a hard carbon foundation film formed under low-speed film-forming conditions on the side of the piston ring base material, and the hard carbon foundation film is formed with
(Continued)

an arc current value 80% or less of the arc current value during the formation of the hard carbon film.

5 Claims, 10 Drawing Sheets

(51) Int. Cl.
  *C23C 28/00* (2006.01)
  *C23C 14/02* (2006.01)
  *C23C 14/32* (2006.01)
(52) U.S. Cl.
  CPC .......... *C23C 28/322* (2013.01); *C23C 28/343* (2013.01); *C23C 28/347* (2013.01); *F16J 9/26* (2013.01)

(56) References Cited

U.S. PATENT DOCUMENTS

| | | | |
|---|---|---|---|
| 2009/0026712 | A1 | 1/2009 | Kawanishi et al. |
| 2011/0140367 | A1* | 6/2011 | Shi ................... C23C 14/025 204/192.1 |
| 2012/0205875 | A1* | 8/2012 | Kennedy ............ C23C 16/0281 277/442 |
| 2012/0248711 | A1 | 10/2012 | Iwashita et al. |
| 2015/0137457 | A1 | 5/2015 | Iwashita et al. |

FOREIGN PATENT DOCUMENTS

| | | |
|---|---|---|
| JP | 2003-26414 A | 1/2003 |
| JP | 2003-42293 A | 2/2003 |
| JP | 2007-232026 A | 9/2007 |
| JP | 2008-297477 A | 12/2008 |
| JP | 2012-202522 A | 10/2012 |
| WO | 2009/151403 A1 | 12/2009 |
| WO | 2009/151404 A1 | 12/2009 |

OTHER PUBLICATIONS

Hakovirta, et al., "Graphite particles in the diamond-like a-C films prepared with the pulsed arc-discharge method", Diamond and Related Materials, Elsevier Science Publishers, vol. 4, No. 12, Nov. 1, 1995, pp. 1335-1339 (5 pages).
Oohira, K., "Characteristics and Applications of DLC films", NTN Technical Review, No. 77, 2009, 13 pages total.
Third Party Information Statement Sheet filed in Japanese Patent Office Dec. 22, 2016.
International Search Report of PCT/JP2015/052680, dated Apr. 21, 2015. [PCT/ISA/210].
Written Opinion of PCT/JP2015/052680, dated Apr. 21, 2015. [PCT/ISA/237].
Submission of publications to Japanese Patent Office by the third party dated Apr. 2, 2018 in Japanese Application No. 2015-560038.

* cited by examiner

[Fig. 1A]
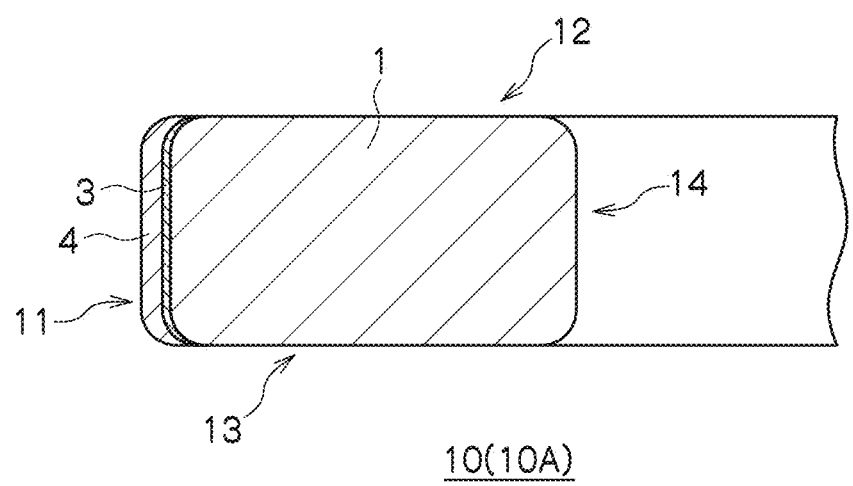
10(10A)
[Fig. 1B]
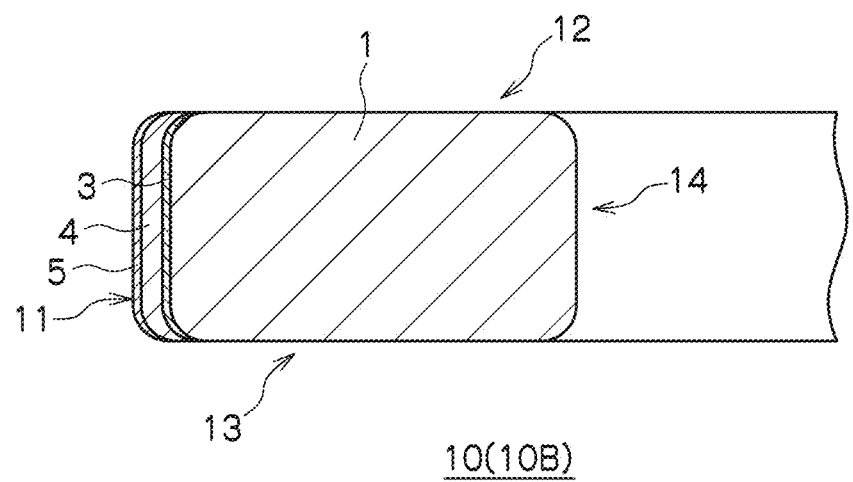
10(10B)

[Fig. 2]
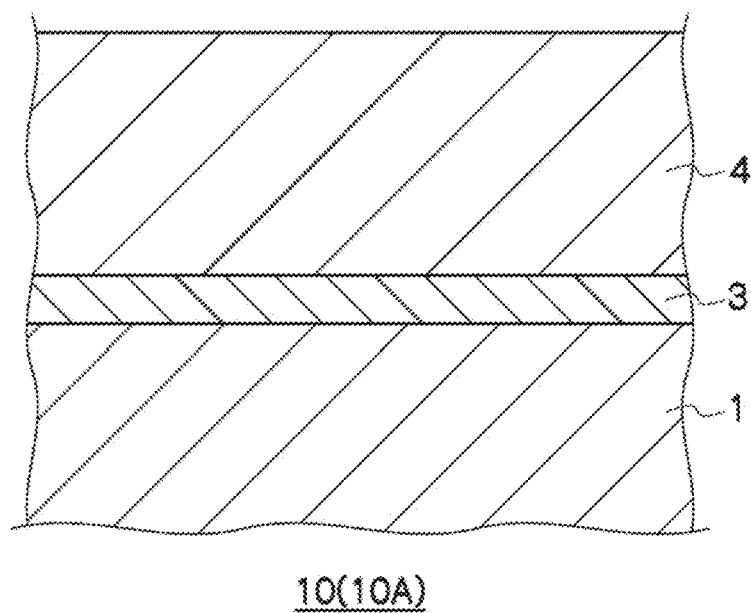
10(10A)

[Fig. 3]
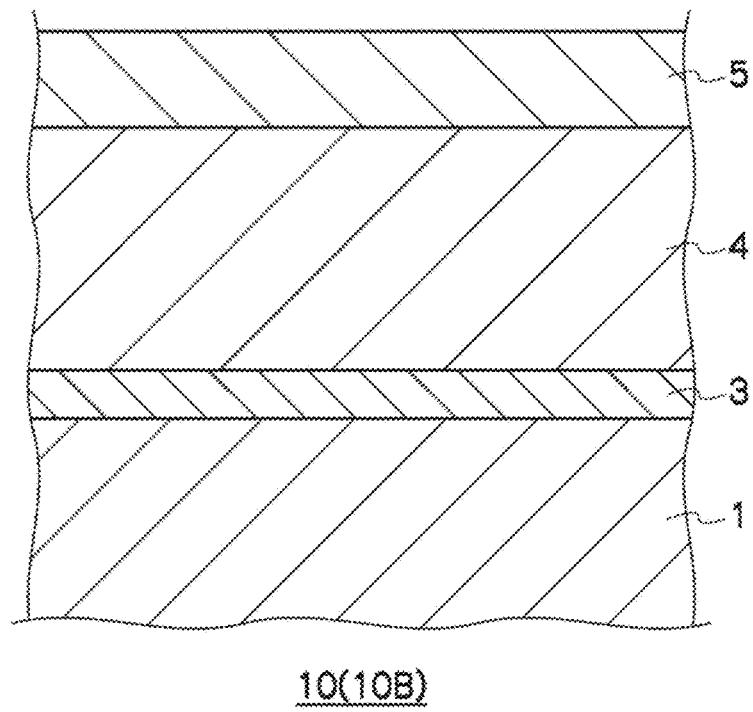
10(10B)

[Fig. 4A]
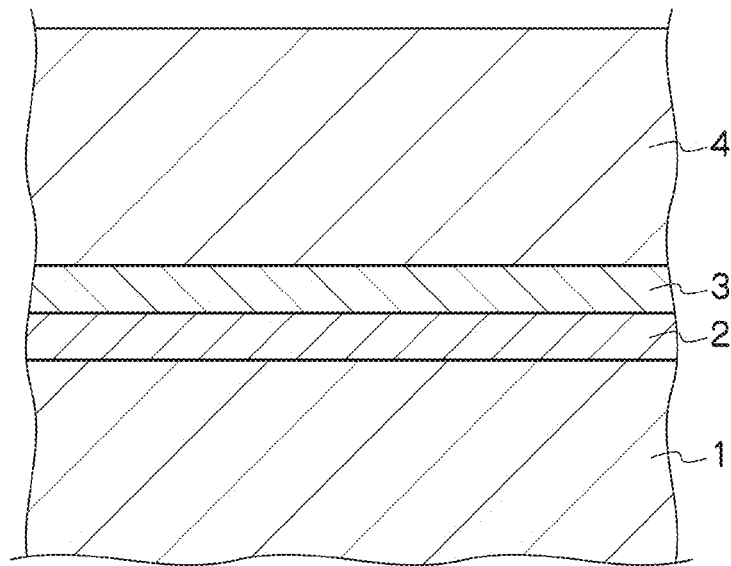
10(10C)
[Fig. 4B]
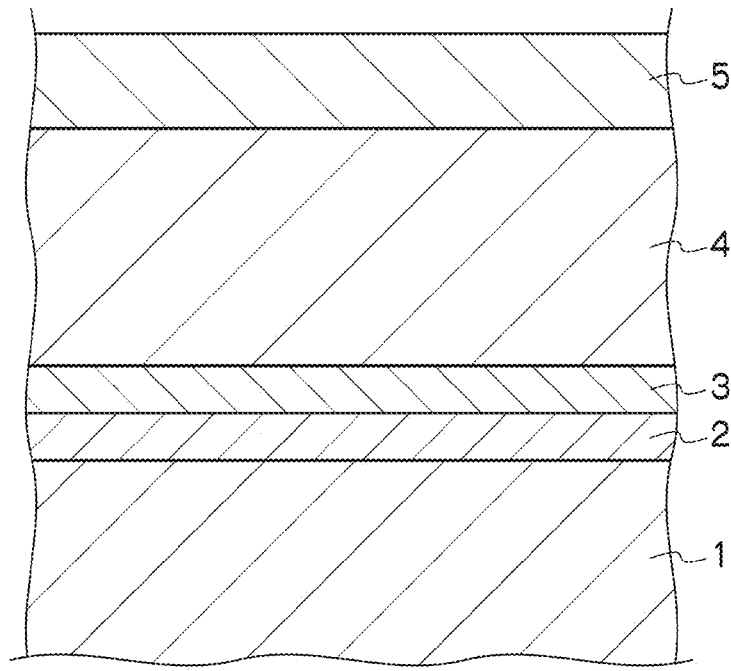
10(10D)

[Fig. 5A]
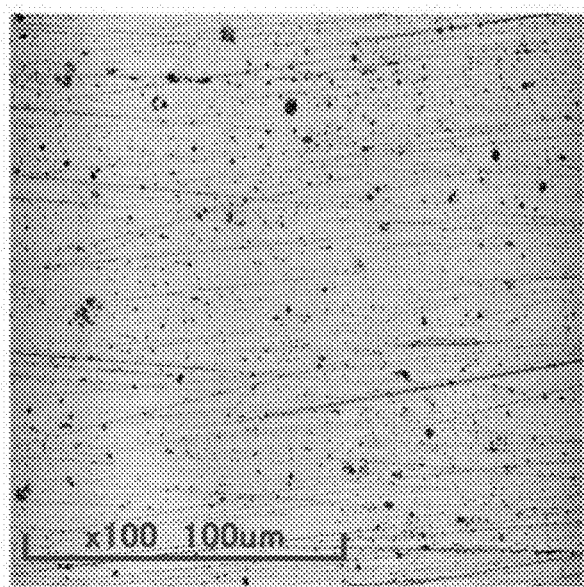
[Fig. 5B]
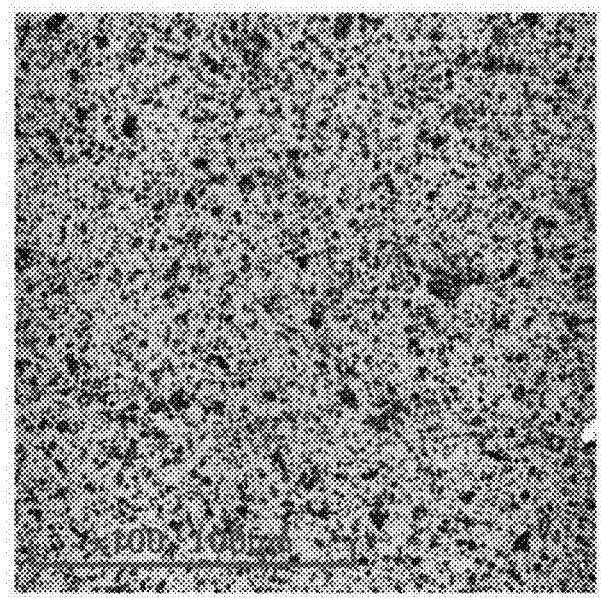

[Fig. 6A]
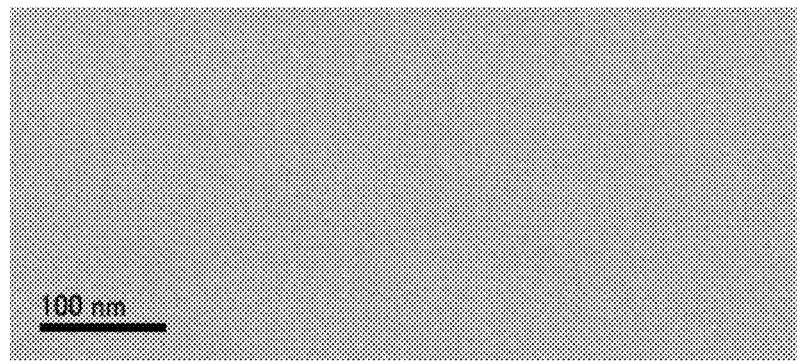
[Fig. 6B]
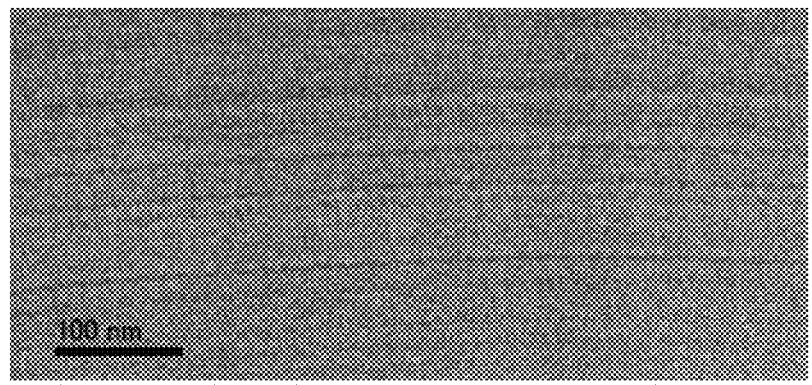

[Fig. 7]
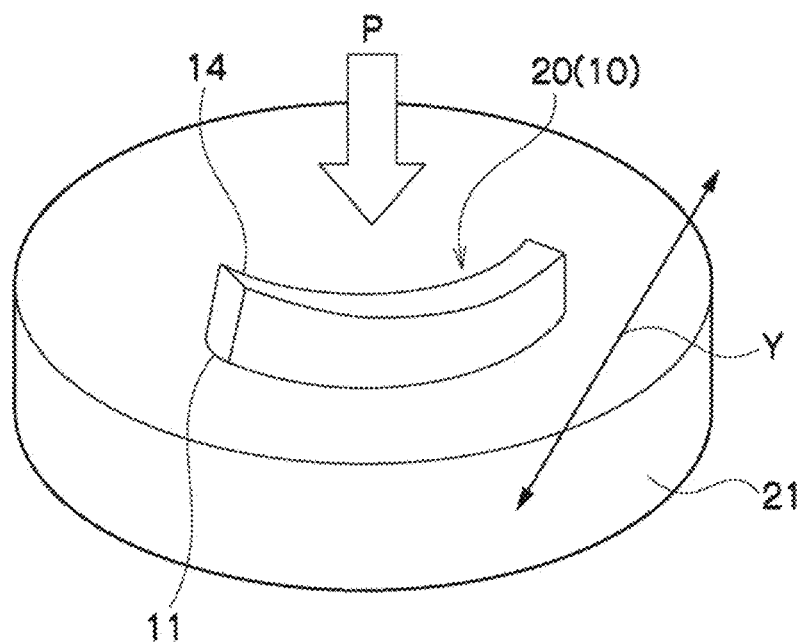

[Fig. 8A]
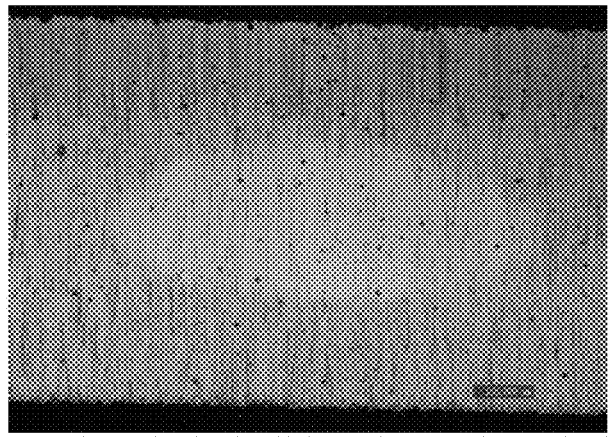
[Fig. 8B]
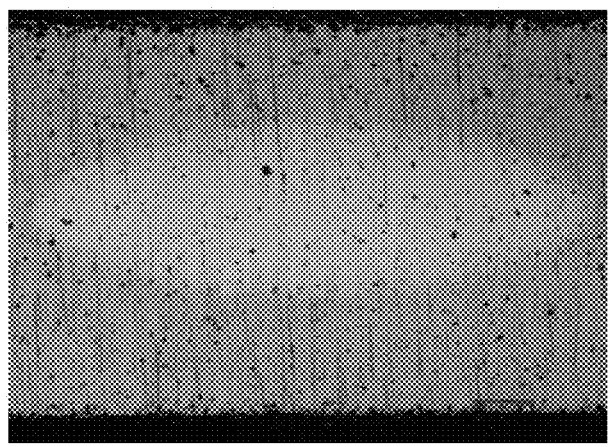
[Fig. 8C]
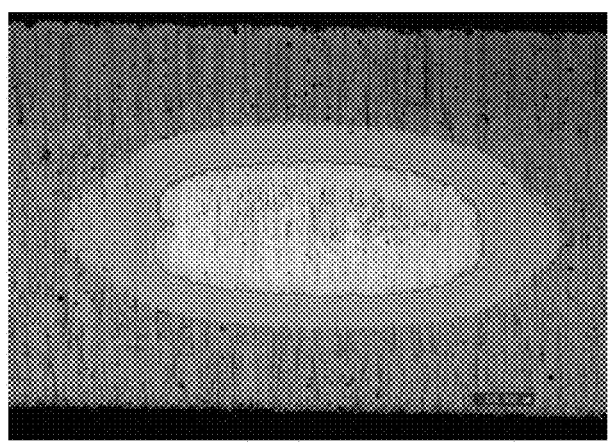

[Fig. 9]
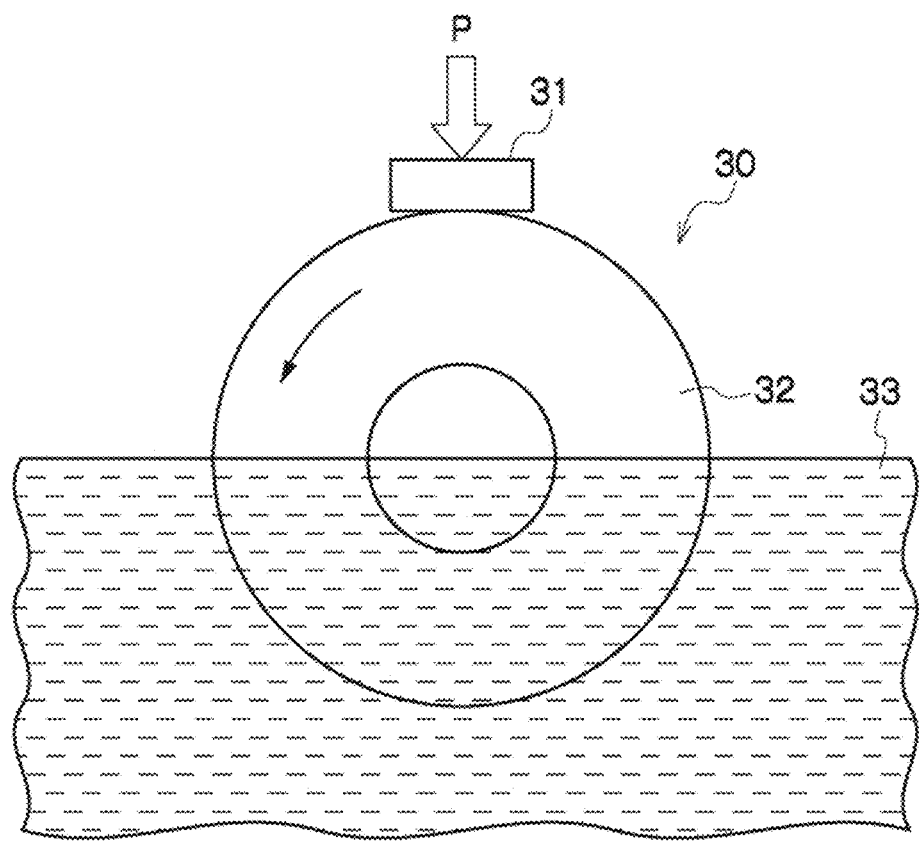

[Fig. 10]
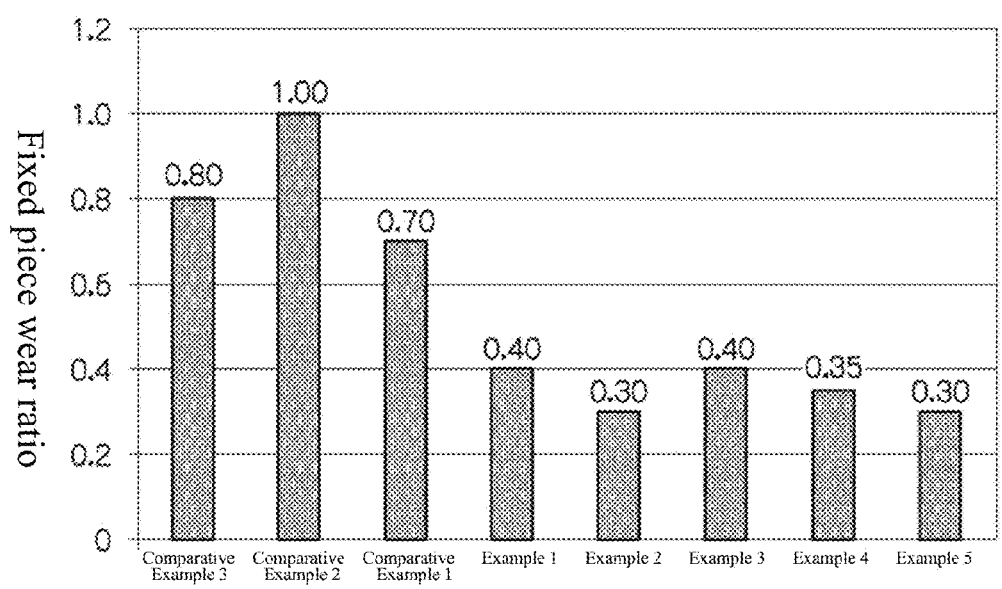

PISTON RING AND MANUFACTURING METHOD THEREFOR

CROSS REFERENCE TO RELATED APPLICATIONS

This application is a National Stage of International Application No. PCT/JP2015/052680 filed Jan. 30, 2015, claiming priority based on Japanese Patent Application Nos. 2014-016344, filed Jan. 31, 2014, and 2014-201838, filed Sep. 30, 2014, the contents of all of which are incorporated herein by reference in their entirety.

FIELD OF THE INVENTION

The present invention relates to a piston ring provided with a hard carbon film exhibiting exceptional wear resistance, and a manufacturing method therefor.

BACKGROUND ART

Piston rings used in internal combustion engines have been increasingly used under harsh high-temperature, high-pressure environments in recent years, demanding further improvement in wear resistance, running-in property, low friction, and the like. In response to such demands, Patent Document 1 (Japanese Laid-Open Patent Application No. 2012-202522), for example, proposes a piston ring provided with a carbon-based coating exhibiting low friction and wear resistance. Specifically, Patent Document 1 proposes a piston ring having a laminated coating comprising two types of layers having different hardnesses laminated in at least two layers, a hardness difference between the two types of layers being 500 to 1700 HV, a high hardness layer having the same or greater thickness than a low hardness layer, and the coating as a whole having a thickness of 5.0 μm or greater. At this time, the low hardness layer is formed by sputtering, and the high hardness layer is formed by ion plating.

Further, Patent Document 2 (Japanese Laid-Open Patent Application No. 2007-169698) proposes a piston ring having an amorphous hard carbon coating excellent in adhesiveness to a piston ring base material, high in hardness, and excellent in wear resistance. Specifically, Patent Document 2 proposes a piston ring having a first amorphous hard carbon layer formed on a surface of the piston ring base material and substantially consisting of only carbon without hardly any hydrogen, and a second amorphous hard carbon layer formed on a surface of the first amorphous hard carbon layer and substantially consisting of only carbon. When viewed from a cross section, a transmission electron microscopic image of the first amorphous hard carbon layer is brighter than that of the second amorphous hard carbon layer.

PRIOR ART DOCUMENTS

Patent Documents

Patent Document 1: Japanese Laid-Open Patent Application No. 2012-202522
Patent Document 2: Japanese Laid-Open Patent Application No. 2007-169698

SUMMARY OF THE INVENTION

Problems to be Solved by the Invention

Nevertheless, the technology of Patent Document 1 is a multi-layered structure having layers of different hardnesses alternately repeatedly laminated in different film-forming means, making formation of the coating complex. Further, with the high hardness layer having a thickness of 5 to 90 nm, the high hardness layer cannot always be maintained on the topmost surface, making it difficult to maintain wear resistance. Furthermore, while the technology of Patent Document 2 describes the relationship between brightness of the transmission electron microscope and density as well as adhesiveness with the base material, whether or not the layers are amorphous hard carbon layers high in hardness and excellent in wear resistance had not been adequately studied.

The present invention was made to resolve the above-described problems, and it is therefore an object of the present invention to provide a piston ring having a hard carbon film that is easy to form and exhibits exceptional wear resistance, and a manufacturing method therefor.

Means for Solving the Problems (1) A piston ring according to the present invention for resolving the above-described problems has a hard carbon film formed on at least an external peripheral sliding surface of a piston ring base material, the hard carbon film having an $sp^2$ component ratio within a range of 40% to 80% inclusive as measured by a TEM-EELS spectrum which combines electron energy loss spectroscopy (EELS) with a transmission electron microscope (TEM), the hydrogen content being in a range of 0.1 at. % to 5 at. % inclusive, and the amount of macroparticles appearing on the surface being in a range of 0.1% to 10% inclusive by area ratio.

According to this invention, in the hard carbon film formed on at least the external peripheral sliding surface of the piston ring base material, the amount of macroparticles appearing on the surface is within a range of 0.1% to 10% inclusive by area ratio, resulting in a decrease in an unevenness of the surface. As a result, surface smoothing treatment, such as lapping or buffing, performed as final machining is no longer necessary, making it possible to provide a piston ring at low cost. Further, the hard carbon film has an $sp^2$ component ratio within the range of 40% to 80% inclusive as measured by a TEM-EELS spectrum, making it possible to provide a piston ring exhibiting exceptional wear resistance.

In the piston ring according to the present invention, the hard carbon film is formed on a hard carbon foundation film formed under low-speed film-forming conditions on the side of the piston ring base material and having a thickness within the range of 0.05 μm to 0.5 μm inclusive.

According to this invention, the hard carbon foundation film formed under low-speed film-forming conditions and having a thickness within the range of 0.05 μm to 0.5 μm inclusive is formed on the side of the piston ring base material of the hard carbon film, thereby suppressing nucleation and growth in the hard carbon foundation film. As a result, increases in macroparticles in the hard carbon film formed on the hard carbon foundation film are suppressed, making it possible to form a smooth film with little surface unevenness and therefore improve wear resistance.

In the piston ring according to the present invention, the hard carbon foundation film is preferably formed with an arc current value 80% or less of the arc current value during the formation of the hard carbon film.

According to this invention, the hard carbon foundation film is formed with an arc current value 80% or less of the arc current value during the formation of the hard carbon film, thereby eliminating the occurrence of nucleation and growth from sudden increases in arc current, making it possible to suppress poor adhesion as well.

In the piston ring according to the present invention, the hard carbon film may be a single-layered film formed under certain film-forming conditions, or a nano-laminated film formed under a plurality of film-forming conditions.

In the piston ring according to the present invention, a foundation film made of titanium or chromium may be formed on the piston ring base material.

(2) A manufacturing method for a piston ring according to the present invention for solving the above-described problems is a manufacturing method for a piston ring having an amount of macroparticles appearing on a surface of a hard carbon film within a range of 0.1% to 10% inclusive by area ratio, the method comprising: a hard carbon foundation film forming step of forming a hard carbon foundation film formed by a physical vapor deposition method on at least an external peripheral sliding surface of a piston ring base material under lower speed film-forming conditions than the film-forming conditions of a hard carbon film forming step described below, and a hard carbon film forming step of forming a hard carbon film formed by the same physical vapor deposition method as described above on the hard carbon foundation film under film-forming conditions that result in an $sp^2$ component ratio within a range of 40% to 80% inclusive as measured by a TEM-EELS spectrum, and a hydrogen content within a range of 0.1 at. % to 5 at. % inclusive.

According to this invention, while the hard carbon foundation film is formed on at least the external peripheral sliding surface of the piston ring base material, this hard carbon foundation film is formed under lower speed film-forming conditions than the film-forming conditions of the hard carbon film forming step, making it possible to set the amount of macroparticles appearing on the surface of the formed hard carbon film within the range of 0.1% to 10% inclusive by area ratio, and thus decrease the unevenness of the surface. As a result, surface smoothing treatment, such as lapping or buffing, performed as final machining is no longer necessary, making it possible to manufacture a piston ring exhibiting exceptional wear resistance at low cost. Further, the hard carbon film is formed on the hard carbon foundation film, making it possible to manufacture a piston ring that has an $sp^2$ component ratio within the range of 40% to 80% inclusive as measured by a TEM-EELS spectrum, and exhibits exceptional wear resistance.

In the manufacturing method for a piston ring according to the present invention, among the low-speed film-forming conditions in the hard carbon foundation film forming step, an arc current value is preferably 80% or less of the arc current value in the hard carbon film forming step.

In the manufacturing method for a piston ring according to the present invention, the method may further comprise a foundation film forming step of forming titanium or chromium on the piston ring base material before the hard carbon foundation film forming step.

In the manufacturing method for a piston ring according to the present invention, the hard carbon film formed in the hard carbon film forming step may be a single-layered film formed under certain film-forming conditions, or a nano-laminated film formed under a plurality of film-forming conditions.

In the manufacturing method for a piston ring according to the present invention, the nano-laminated film may be formed by alternately applying at least two different bias voltages.

Effect of the Invention

According to the present invention, it is possible to provide a piston ring having a hard carbon film that is easy to form and exhibits exceptional wear resistance, and a manufacturing method therefor.

BRIEF DESCRIPTION OF THE DRAWINGS

FIGS. 1A and 1B are schematic cross-sectional views illustrating an example of a piston ring according to the present invention.

FIG. 2 is a schematic cross-sectional view illustrating an example of a sliding surface of the piston ring according to the present invention.

FIG. 3 is a schematic cross-sectional view illustrating another example of the sliding surface of the piston ring according to the present invention.

FIGS. 4A and 4B are schematic cross-sectional views illustrating yet another example of the sliding surface of the piston ring according to the present invention.

FIGS. 5A and 5B are surface images of hard carbon films having different amounts of macroparticles according to film-forming conditions.

FIGS. 6A and 6B are cross-sectional views of a hard carbon film (A) made of a single-layered film, and a topmost surface film (B) made of a nano-laminated film.

FIG. 7 is a schematic diagram of the principle of a friction and wear test using a disk-type test piece.

FIGS. 8A, 8B, and 8C are images showing SRV test results.

FIG. 9 is a schematic diagram of the principles of a wear test and scuff load measurement using a rotational plane sliding friction tester.

FIG. 10 is a graph showing the wear test results.

EMBODIMENTS OF THE INVENTION

The following describes a piston ring and a manufacturing method therefor according to the present invention, with reference to the drawings. The present invention is not limited to the embodiment below as long as the technical characteristics of the present invention are included.

A piston ring 10 according to the present invention, as illustrated in FIGS. 1 to 4B, has a hard carbon film 4 formed on at least an external peripheral sliding surface 11 of a piston ring base material 1. Then, the hard carbon film 4 has an $sp^2$ component ratio within a range of 40% to 80% inclusive as measured by a TEM-EELS spectrum, a hydrogen content within a range of 0.1 at. % to 5 at. % inclusive, and an amount of macroparticles appearing on the surface within a range of 0.1% to 10% inclusive by area ratio.

In this piston ring 10, the amount of macroparticles appearing on the surface of the hard carbon film 4 formed on at least the external peripheral sliding surface 11 is within a range of 0.1% to 10% inclusive by area ratio, resulting in a decrease in the unevenness of the surface. As a result, surface smoothing treatment, such as lapping or buffing, performed as final machining is no longer necessary, resulting in the advantage of making it possible to provide a piston ring at low cost. Further, the hard carbon film 4 has an $sp^2$ component ratio within the range of 40% to 80% inclusive as measured by a TEM-EELS spectrum, resulting in exceptional wear resistance.

The following describes the components of the piston ring and the manufacturing method therefor in detail.

(Piston Ring Base Material)

Examples of the materials used as the piston ring base material 1 serving as the base material of the piston ring 10 are various and not particularly limited. For example, materials such as various steel materials, stainless steel materials, casting materials, cast steel materials, and the like can be applied. Among these, examples include a martensitic stainless steel, a chromium manganese steel (SUPS), a chrome-vanadium steel (SUP10), a silicon chrome steel (SWOSC-V), and the like.

A nitride layer (not illustrated) and a wear resistant coating (not illustrated) may be formed on the piston ring base material 1 in advance. Such a nitride layer is formed by performing nitriding treatment, and such a wear resistant coating is a coating such as a Cr—N based, a Cr—B—N based, a Cr—B—V—N based, or a Ti—N based coating. Nevertheless, the piston ring 10 according to the present invention, as described later, has the remarkable advantage of allowing formation of a uniform hard carbon film 4, and thus adequately exhibits exceptional wear resistance without such a nitriding treatment or formation of a Cr based or a Ti based wear resistant coating. As a result, nitriding treatment and formation of a Cr based or Ti based wear resistant coating are not necessarily required.

It should be noted that the piston ring base material 1 may be pretreated as necessary. Such a pretreatment is preferably performed by polishing the surface to adjust surface roughness. Adjustment of the surface roughness is preferably performed by, for example, methods such as lapping and polishing the surface of the piston ring base material 1 using diamond abrasive grains. Such an adjustment of surface roughness makes it possible to adjust the surface roughness of the piston ring base material 1 to within a preferred range of 0.02 µm to 0.07 µm inclusive as an arithmetic mean roughness Ra based on JIS B 0601 (2001) and ISO4287: 1997. The piston ring base material 1 thus adjusted can be preferably applied as a pretreatment before formation of a hard carbon foundation film 3, or as a pretreatment for a foundation film 2 provided in advance before formation of the hard carbon foundation film 3.

(Foundation Film)

The foundation film 2 made of titanium, chromium, or the like may be provided to the piston ring base material 1, as illustrated in FIG. 4. The foundation film 2 does not necessarily have to be provided, and thus formation is optional. The foundation film 2 made of titanium or chromium may be formed by various film-forming means. Examples of applicable film-forming means include a vacuum deposition method, a sputtering method, and an ion plating method. While a thickness of the foundation film 2 is not particularly limited, a thickness within a range of 0.05 µm to 2 µm inclusive is preferred. It should be noted that, while the foundation film 2 is preferably formed on at least the external peripheral sliding surface 11 on which sliding occurs upon contact by the piston ring 10 with a cylinder liner (not illustrated), the foundation film 2 may be formed on other surfaces, such as an top surface 12, a bottom surface 13, or an internal peripheral surface 14 of the piston ring 10.

The foundation film 2 can be formed by means such as a vacuum depositing method or an ion plating method of inserting the piston ring base material 1 inside a chamber, creating a vacuum in the chamber, performing pre-heating, ion cleaning, and the like, and introducing an inert gas.

Preferably, this foundation film 2, as illustrated in FIG. 4, is directly formed on the piston ring base material 1, and the hard carbon foundation film 3 described later is formed on this foundation film 2. The foundation film 2 improves the adhesiveness between the piston ring base material 1 and the hard carbon foundation film 3 as well as the hard carbon film 4 and, by forming the hard carbon foundation film 3 on the foundation film 2, can further suppress nucleation and growth when the hard carbon foundation film 3 is formed at low speed. As a result, the hard carbon film 4 formed on the hard carbon foundation film 3 can be formed as a smooth film having little surface unevenness.

(Hard Carbon Foundation Film)

The hard carbon foundation film 3 is provided on the piston ring base material 1. Specifically, the hard carbon foundation film 3 is formed on at least the external peripheral sliding surface 11 on which sliding occurs upon contact by the piston ring 10 with the cylinder liner (not illustrated), but may also be optionally formed on other surfaces, such as the top surface 12, the bottom surface 13, and the internal peripheral surface 14 of the piston ring 10.

The hard carbon foundation film 3, as illustrated in FIGS. 1 to 3, may be directly provided on the piston ring base material 1, or provided on the foundation film 2 made of a titanium film or the like provided on the piston ring base material 1, as illustrated in FIGS. 4A and 4B. It should be noted that the hard carbon film 4 described later is provided directly on the hard carbon foundation film 3 without another film being interposed therebetween.

The hard carbon foundation film 3 has the same components as those of the hard carbon film 4 described later, and is formed in a formation process in a stage before formation of the hard carbon film 4. The hard carbon foundation film 3 can be formed by film-forming means such as an ion plating method based on vacuum arc discharge using a carbon target. For example, when the hard carbon foundation film 3 is formed by an ion plating method based on vacuum arc discharge (hereinafter "arc ion plating method"), film formation can be achieved specifically by inserting the piston ring base material 1 or the piston ring base material 1 provided with the foundation film 2 in advance into a chamber, creating a vacuum in the chamber, opening a shutter that blocks the carbon target, and discharging carbon plasma from the carbon target.

The hard carbon foundation film 3 is formed by performing control so as to decrease, among the film-forming conditions of the hard carbon film 4 described later, the film-forming speed. That is, the hard carbon foundation film 3 is formed under low-speed film-forming conditions. Examples of methods of decreasing such a film-forming condition include decreasing the arc current in an arc ion plating method. Among such methods, film formation using an arc ion plating method with an arc current within a range of 40 A to 100 A and a pulse bias voltage within a range of −2000 V to −100 V is preferred.

The above-described arc current at the time that this hard carbon foundation film 3 is formed is smaller than the arc current when forming the hard carbon film 4 described later. This makes it possible to suppress poor adhesion caused by sudden increases in arc current that readily occur when the hard carbon film 4 is formed without forming the hard carbon foundation film 3 on the piston ring base material 1. Furthermore, film formation of the hard carbon foundation film 3 by a small arc current makes it possible to suppress nucleation as well as growth, making it possible to suppress increases in macroparticles. Such suppression of increases in macroparticles facilitates formation of the hard carbon film 4 described later as a smooth film unaffected by the hard carbon foundation film 3 and having little surface unevenness.

When decreased, the arc current is preferably set to an arc current value 80% or less of the arc current value during formation of the hard carbon film 4. When formed with an arc current value of 80% or less, the hard carbon foundation film 3 can effectively exhibit its function as a hard carbon foundation film 3. That is, the hard carbon foundation film 3 formed under low-speed film-forming conditions achieves suppression of nucleation as well as growth. As a result, the hard carbon film 4 formed on the hard carbon foundation film 3 can suppress poor adhesion caused by sudden increases in arc current, and can suppress increases in macroparticles. The suppression of increases in macroparticles makes it possible to form the hard carbon film 4 as a smooth film unaffected by the hard carbon foundation film 3 and having little surface unevenness. As a result, wear resistance can be improved. It should be noted that the arc current value at this time preferably has a lower limit of 50% the arc current value during formation of the hard carbon film 4 to ensure favorable action as the hard carbon foundation film 3.

The above-described action of the hard carbon foundation film 3 formed under low-speed film-forming conditions can be effectively realized with a thickness within a range of 0.05 μm to 0.5 μm inclusive. When the thickness is too thin, the difficulty arises that the macroparticle suppression effect cannot be achieved. When the thickness is too thick, the difficulty arises that the film-forming speed of the hard carbon film slows down, resulting in an increase in cost.

It should be noted that the hardness of the hard carbon foundation film 3 thus formed is within a range of about 1500 to 2500 by Vickers hardness (HV). Furthermore, due to the difficulties in measuring the Vickers hardness of the hard carbon foundation film 3 itself resulting from the hard carbon foundation film 3 being too thin, the measurement is obtained by assessing the film by Vickers hardness when the film is thickly formed to about 5 μm under the same film-forming conditions. This measurement can be made using a Vickers hardness tester (manufactured by Akashi), and "HV (0.05)" indicates the Vickers hardness at a load of 50 gf, for example. Further, measurement by a nanoindentation method can be made using a nanoindentation device manufactured by Elionix, for example.

(Hard Carbon Film)

The hard carbon film 4, as illustrated in FIGS. 1, 2, and 4A, is formed on at least the external peripheral sliding surface 11 on which sliding occurs upon contact by the piston ring 10 with the cylinder liner (not illustrated), but may also be optionally formed on other surfaces, such as the top surface 12, the bottom surface 13, and the internal peripheral surface 14 of the piston ring 10.

The hard carbon film 4 is an amorphous carbon film, and is a film having a low coefficient of friction against opposing materials and favorable wear resistance. Specifically, the hard carbon film 4 includes, in addition to carbon, hydrogen within a range of 0.1 at. % to 5 at. % inclusive.

Such a hard carbon film 4 is also formed by the same arc ion plating method as the film-forming method of the hard carbon foundation film 3 described above. Formation using the same arc ion plating method is advantageous for manufacturing compared to formation using a different method. Preferably, the thickness of the hard carbon film 4 is within a range of 0.5 μm to less than 2 μm when forming a thin film, and within a range of 2 μm to 10 μm inclusive when forming a thick film. In thin films, a thickness of the hard carbon film 4 within this range makes it possible to improve running-in property and wear resistance. In thick films, such a thickness results in the advantage of further continuation of such effects. It should be noted that, as a more preferred range, the thickness is more preferably within a range of 0.6 μm to 1.5 μm inclusive in thin films, and within a range of 2.5 μm to 6 μm inclusive in thick films.

In the present invention, formation of this hard carbon film 4 and the above-described hard carbon foundation film 3 is performed under conditions that do not include hydrogen components. Formation of the hard carbon foundation film 3 and the hard carbon film 4 can be preferably achieved using a carbon target and an arc ion plating method that does not include hydrogen atoms in film-forming raw materials. As a result, the hard carbon foundation film 3 and the hard carbon film 4 do not include or substantially do not include hydrogen components. "Substantially do not include" means that the hydrogen content included in the hard carbon foundation film 3 and the hard carbon film 4 is 5 at. % or less.

The hard carbon film 4 is directly provided on the hard carbon foundation film 3 that has been formed under low-speed film-forming conditions to achieve suppression of nucleation and growth, and suppression of increases in macroparticles, and therefore can be formed as a smooth film having little surface unevenness. The amount of macroparticles appearing on the surface of the hard carbon film 4 is within a range of 0.1% to 10% inclusive by area ratio. As a result, it is possible to achieve a hard carbon film 4 exhibiting exceptional wear resistance and running-in property. It should be noted that FIGS. 5A and 5B are surface images of hard carbon films having different amounts of macroparticles according to film-forming conditions. FIG. 5A is an example in which the area ratio of the macroparticles is small, and FIG. 5B is an example in which the area ratio of the macroparticles is large.

The area ratio of the amount of macroparticles can be obtained by image analysis using a confocal microscope (OPTELICS H1200) manufactured by Lasertec. Specifically, an image of the piston ring external periphery (100× objective lens, monochrome confocal image) is taken and subjected to automatic binarization. The threshold value is determined using a discriminant analysis method, adjustments are made so as to exclude polishing flaws, and then the area ratio is extracted from the binarized image. The area ratio of macroparticles is obtained by measuring any five locations on the film and taking the average of the results.

The hard carbon film 4 is preferably formed using an arc ion plating method with an arc current within a range of 80 A (where the value is greater than the arc current of the hard carbon foundation film 3) to 120 A, and a pulse bias voltage within a range of −2000 V to −100 V.

The amount of macroparticles appearing on the surface of the hard carbon film 4 can be set within a range of 0.1% to 10% inclusive by area ratio. As a result, the hard carbon film 4 can exhibit exceptional wear resistance. The area ratio of the amount of macroparticles can be obtained using the same method as described above. When the amount of macroparticles exceeds 10% by area ratio, the unevenness of the surface may increase, making it no longer possible to achieve exceptional wear resistance. On the other hand, when the amount of macroparticles is less than 0.1% by area ratio, exceptional wear resistance can be achieved, but film formation may be not be easy, resulting in difficulties in manufacturing management and cost aspects.

This hard carbon film 4 may be a single-layered film provided under simplex film-forming conditions as shown in FIG. 6A, or a nano-laminated film formed under a plurality of film-forming conditions as shown in FIG. 6B, which illustrates a topmost surface film 5. The nano-laminated film in this case is formed by, for example, repeatedly changing the film-forming conditions, such as the arc current and the bias current, over time, making it possible to provide a film that appears in a state having striated layers laminated in the thickness direction in FIG. 6B.

When the hard carbon film 4 is a nano-laminated film, the nano-laminated film may be formed by alternately applying at least two different bias voltages in pulses. For example, the nano-laminated film may be formed by 1) alternately applying a predetermined low bias voltage and a predetermined high bias voltage in pulses by, for example, alternately applying a −140 V low bias voltage and a −220 V high bias voltage in pulses; 2) alternately applying a predetermined low bias voltage and a gradually increasing bias voltage in pulses as pulse voltages by, for example, alternately applying a −140 V low bias voltage and a high bias voltage that gradually increases by −160 V increments from −220 V in pulses; or 3) alternately applying a predetermined low bias voltage and a predetermined high bias voltage in pulses by, for example applying a −140 V low bias voltage, a −220 V high bias voltage, a −150 V low bias voltage, and a −1800 V high bias voltage in pulses in that cycle order. It should be noted that examples of film formation by alternately applying at least two different bias voltages in pulses are not limited to the above 1) to 3), and other examples may be applied. Furthermore, the repeated count of the pulse bias is set so that the thickness of the nano-laminated film is within the above-described range.

When the hard carbon film 4 comprising the above-described nano-laminated film is provided on the hard carbon foundation film 3, there is the advantage that film peeling can be further suppressed compared to when the hard carbon film 4 comprising a single-layered film and exhibiting high wear resistance is provided on the hard carbon foundation film 3. The reason for further suppression is that, when the hard carbon film 4 that comprises a single-layered film and exhibits high wear resistance is provided on the hard carbon foundation film 3, the robustness of the hard carbon film 4 causes the load applied to the piston ring to be applied to an interface between the piston ring base material 1 and the hard carbon foundation film 3 or to an interface between the foundation film 2 and the hard carbon foundation film 3, causing the possibility that the hard carbon film 4 will peel to slightly remain. However, among the at least two different types of bias voltages for forming the hard carbon film 4 comprising a nano-laminated film such as described above, a film formed using the low bias voltage functions as a stress relaxing film. As a result, the hard carbon film 4 acts so as to reduce the load applied to the interface between the piston ring base material 1 and the hard carbon foundation film 3. Further, when the foundation film 2 is formed, the foundation film 2 acts so as to reduce the load applied to the interface between the foundation film 2 and the hard carbon foundation film 3.

The piston ring 10 provided with such a hard carbon film 4 is capable of eliminating film peeling at gaps hit hard when temperature is applied, and is therefore particularly preferred.

The hardness of the hard carbon film 4 is within a range of about 1500 to 2500 by Vickers hardness (HV). Further, the hardness of the hard carbon film 4 is within a range of 15 GPa to 30 GPa inclusive when measured by a nanoindentation method. It should be noted that Vickers hardness can be measured using a micro Vickers hardness tester (manufactured by Akashi), and "HV (0.05)" indicates the Vickers hardness at a load of 50 gf, for example. Further, measurement by a nanoindentation method can be made using the same method as described above.

A "hard carbon film" is a film in which a carbon bond $sp^2$ represented by graphite and a carbon bond $sp^3$ represented by diamond are mixed together. An "$sp^2$ component ratio" expresses the component ratio ($sp^2/(sp^2+sp^3)$) of the graphite component ($sp^2$) to the graphite component ($sp^2$) and the diamond component ($sp^3$) of the hard carbon film.

The hard carbon film 4 preferably has an $sp^2$ component ratio within a range of 40% to 80% inclusive as measured by a TEM-EELS spectrum which combines electron energy loss spectroscopy (EELS) with a transmission electron microscope (TEM). An $sp^2$ component ratio of less than 40% results in the diamond component ($sp^3$) being the main component, causing the film to be fine but low in toughness, and therefore is not preferred for formation of a hard carbon film. An $sp^2$ component ratio that exceeds 80% results in the graphite component ($sp^2$) being the main component, making formation of the hard carbon film difficult, and therefore is not preferred. Such a covalent bond ratio can be measured by an EELS analyzer (manufactured by Gatan; model 863GIF Tridiem). This measurement can be made by the steps below.

First, (1) the EELS spectrum is measured by the EELS analyzer. A pre-peak area is fit using a linear function, and a post-peak area is fit using a cubic function to the measured EELS spectrum to normalize a peak intensity. (2) Subsequently, the diamond data and the graphite data are compared, and the energy is calibrated with the peak start position aligned. (3) The surface area within a range of 280 eV to 310 eV is found for the calibrated data. (4) The area is divided into two peaks (one being an $sp^2$ peak and the other being a CH and an amorphous peak) within the range of 280 eV to 295 eV, and the peak surface area near 285 eV is found. (5) The surface area within the 280 eV to 310 eV range of (3) above, and the peak surface area near 285 eV of (4) above are captured. For this ratio, the $sp^2$ component ratio is found from relative values given a graphite value of 100 and a diamond value of 0. The value thus found is the $sp^2$ component ratio.

It should be noted that the $sp^2$ component ratio of the hard carbon film is assessed by finding a plurality of points at an equal interval in the thickness direction of each film as measurement points, whether the hard carbon film is a single-layered film or a nano-laminated film. While the number of measurement points is not particularly limited, the number may be two as in examples 1 and 2 described later, or ten as in example 5. In the present application, the "$sp^2$ component ratio" obtained by the plurality of measurement points is defined as an average value of the films when the measurement points are not particularly indicated.

(Topmost Surface Film)

The topmost surface film 5 can be optionally formed as necessary on the hard carbon film 4 described above. The topmost surface film 5, as illustrated in FIG. 3, FIG. 4B, and FIG. 6B, is a film (also called a nano-laminated film) having laminated thin hard carbon films (nano thin films). This topmost surface film 5 acts so as to further increase running-in property.

The topmost surface film 5, which is a nano-laminated film, is formed by repeatedly performing high bias voltage processing and low bias voltage processing using an arc ion plating method at a predetermined interval a plurality of times. Specifically, the topmost surface film 5 is, in film formation using the arc ion plating method, preferably formed by repeatedly performing high bias voltage processing with the pulse bias voltage within a range of −2000 V to −800 V, and low bias voltage processing with the pulse bias voltage within a range of −200 V to −100 V, at a predetermined interval a plurality of times while maintaining an arc current at the same 100 A to 150 A level as that in the film-forming conditions of the hard carbon film 4. The "predetermined interval" is an interval of about 1 second to 10 seconds inclusive. The topmost surface film 5 thus formed is a film having laminated thin films, as illustrated in FIG. 6B, and exhibits high hardness and increased toughness, thereby preventing cracks and chips and achieving favorable running-in property.

The topmost surface film 5 is laminated to a desired thickness under such conditions. It should be noted that the topmost surface film 5 is formed so that the total thickness thereof is within about 0.05 μm to 1 μm inclusive. When the thickness is too thin, the difficulty arises that the running-in property effect cannot be achieved. When the thickness is too thick, the running-in property effect does not change. It should be noted that the thickness of each layer constituting the topmost surface film 5 is within a range of about 0.01 μm to 0.02 μm inclusive, and the topmost surface film 5 is configured by laminating a plurality of layers having thicknesses within this range. The thickness of such a topmost surface film 5 can be measured by a transmission electron microscope (TEM).

The hardness after such a processing of the topmost surface film 5 is suitably formed to about 2000 by Vickers hardness (HV).

As described above, the piston ring 10 according to the present invention thinly forms a hard carbon foundation film 3 under low-speed film-forming conditions, and thus this hard carbon foundation film 3 achieves suppression of nucleation as well as growth. As a result, the hard carbon film 4 formed on the hard carbon foundation film 3 can suppress poor adhesion caused by sudden increases in arc current, and can suppress increases in macroparticles. Suppression of increases in macroparticles makes it possible to form the hard carbon film 4 as a smooth film having little surface unevenness. As a result, wear resistance can be improved.

EXAMPLES

The following describes the piston ring according to the present invention in further detail using examples, comparative examples, and conventional examples.

Example 1

The piston ring base material 1 equivalent to a SWOSC-V material as defined in JIS standards, including C: 0.55 mass %, Si: 1.35 mass %, Mn: 0.65 mass %, Cr: 0.70 mass %, Cu: 0.03 mass %, P: 0.02 mass %, S: 0.02 mass %, and a remnant of iron and unavoidable impurities, was used. A titanium film having a thickness of 0.3 μm was formed on this piston ring base material 1 as the foundation film 2 upon introduction of an inert gas (Ar) using an ion plating method.

Next, the hard carbon foundation film 3 made of an amorphous carbon film was formed on the foundation film 2. This film was formed at an arc current of 90 A and a pulse bias voltage of −130 V under the conditions of 12 minutes in a high vacuum chamber of 1.0×10-3 Pa or less using an arc ion plating device and a carbon target so as to achieve a thickness of 0.2 μm. The same arc ion plating device was then used at an arc current of 120 A and a pulse bias voltage of −1800 V for 312 minutes to form a film having a thickness of 5.2 μm on the hard carbon foundation film 3. The area ratio of macroparticles appearing on the surface of the hard carbon film 4 was 1.8%. The $sp^2$ component ratio, as measured at two points, was 52% at analysis points on the surface side.

Example 2

In example 1, the topmost surface film 5 was formed so as to achieve a thickness of 0.6 μm by repeatedly applying the pulse bias voltages of −1800 V and −150 V, 720 times at a 3 second interval on the hard carbon film 4, at an arc current of 90 A. The area ratio of macroparticles appearing on the surface of the topmost surface film 5 was 1.5%. The $sp^2$ component ratio, as measured at two points, was 46% at analysis points on the surface side. It should be noted that this topmost surface film 5, as shown in FIG. 6B, was formed by laminating a thin film of about 3 nm in thickness.

Comparative Example 1

On the piston ring base material 1 obtained in example 1, the foundation film 2 was provided in the same manner as example 1 and, without providing the hard carbon foundation film 3, only the hard carbon film 4 was formed at an arc current of 120 A and a pulse bias voltage of −2500 V for 324 minutes so as to achieve a thickness of 5.4 μm. The area ratio of macroparticles was 13.2%, and the $sp^2$ component ratio, as measured at two points, was 73% at analysis points on the surface side.

Comparative Example 2

On the piston ring base material 1 obtained in example 1, the foundation film 2 was provided in the same manner as example 1 and, without providing the hard carbon foundation film 3, only the hard carbon film 4 was formed at an arc current of 180 A and a pulse bias voltage of −100 V for 300 minutes so as to achieve a thickness of 5.0 μm. The area ratio of macroparticles was 34.3%, and the $sp^2$ component ratio, as measured at two points, was 10% at analysis points on the surface side.

Comparative Example 3

On the piston ring base material 1 obtained in example 1, the foundation film 2 was provided in the same manner as example 1, the hard carbon foundation film 3 was further provided, and only the hard carbon film 4 was formed at an arc current of 180 A and a pulse bias voltage of −100 V for 300 minutes so as to achieve a thickness of 5.0 μm. The area ratio of macroparticles was 9.3%, and the $sp^2$ component ratio, as measured at two points, was 12% at analysis points on the surface side.

[$sp^2$ Component Ratio]

The $sp^2$ component ratio was calculated by the following steps (1) to (5). (1) The EELS spectrum is measured by an EELS analyzer (manufactured by Gatan, Inc.; model 863GIF Tridiem). The pre-peak area is fit using a linear function, and the post-peak area is fit using a cubic function to the measured EELS spectrum to normalize the peak intensity. (2) Subsequently, the diamond data and the graphite data are compared, and the energy is calibrated with the peak start position aligned. (3) The surface area within a range of 280 eV to 310 eV is found for the calibrated data. (4) The area is divided into two peaks (one being an $sp^2$ peak and the other being a CH and an amorphous peak) within the range of 280 eV to 295 eV, and the peak surface area near 285 eV is found. (5) The ratio of the surface area within the 280 eV to 310 eV range of (3) above, and the peak surface area near 285 eV of (4) above is captured. For this ratio, the $sp^2$ component ratio is found from relative values given a graphite value of 100 and a diamond value of 0. The value thus found is the sp² component ratio. The hard carbon film and the topmost surface film were analyzed in two locations (analysis points 1 and 2) at an equal interval (each interval of the top surface, top surface side analysis point 1, bottom surface side analysis point 2, and bottom surface being equal) in the thickness direction of each film. FIG. 5A is a surface image of example 1, and FIG. 5B is a surface image of comparative example 1.

TABLE 1

| | Analysis Point | Peak Surface Area (Near 285 eV) | Peak Surface Area (280-310 eV) | Area Ratio | sp² Component Ratio |
|---|---|---|---|---|---|
| Hard Carbon Film | 1 | 1.33 | 24.47 | 0.054 | 52 |
| | 2 | 1.41 | 24.18 | 0.058 | 56 |
| Topmost Surface Film | 1 | 1.17 | 24.19 | 0.048 | 46 |
| | 2 | 1.18 | 24.33 | 0.048 | 46 |
| Graphite | — | 2.33 | 23.41 | 0.100 | 100 |
| Diamond | — | 0.11 | 21.91 | 0.005 | 0 |

[Friction and Wear Test (SRV Test)]

A titanium film was formed to 0.3 μm on the surface (external peripheral sliding surface 11) of the piston ring base material 1 (equivalent to SWOSC-V material as defined in JIS standards; material of example 1) having a ring diameter of φ 80 mm by an ion plating method. The hard carbon film and the like in the respective configurations of examples 1 and 2 and comparative examples 1 and 2 were formed on this piston ring base material 1, a friction and wear test (SRV test; Schwingungs Reihungund and Verschleiss) was performed in the mode illustrated in FIG. 7, and the existence or non-existence of abrasion was observed.

The test conditions were as follows. The hydrogen content of the hard carbon film was set to 0.3 at. %, and the piston ring was cut at a length of 20 mm and used as a sliding side test piece (pin-type test piece) 20. As an opposing side test piece (disk-type test piece) 21, a test piece having the dimensions of φ 24×7.9 mm (with a hardness of HRC 62 or greater) was cut from SUJ2 steel specified as high carbon chromium bearing steel material in JIS G4805 and used to implement an SRV test under the conditions below. The results are shown in Table 2. It should be noted that the symbol Y in FIG. 7 denotes a sliding direction, and a sliding width in the sliding direction was set to 3 mm.

Tester: SRV tester (refer to FIG. 7)
Load: 100 N, 200 N, 300 N, 500 N
Frequency: 50 Hz
Test temperature: 80° C.
Sliding width: 3 mm
Lubricant: 5W-30, 125 mL/hr
Test time: 10 minutes

TABLE 2

| | Macroparticle Area Ratio (%) | sp² Component Ratio (%) | SRV Test Load | | | |
|---|---|---|---|---|---|---|
| | | | 100N | 200N | 300N | 400N |
| Example 1 | 1.8 | 52.0 | ○ | ○ | ○ | ○ |
| Example 2 | 1.5 | 46.0 | ○ | ○ | ○ | ○ |
| Example 3 | 1.9 | 51.0 | ○ | ○ | ○ | ○ |
| Example 4 | 1.5 | 45.0 | ○ | ○ | ○ | ○ |
| Example 5 | 6.0 | 45.6 | ○ | ○ | ○ | ○ |
| Comparative Example 1 | 13.2 | 73.0 | ○ | ○ | ○ | ○ |
| Comparative Example 2 | 34.3 (measurement limit) or above | 10.0 | ○ | Abrasion | Abrasion | Abrasion |
| Comparative Example 3 | 9.3 | 12.0 | ○ | ○ | Abrasion | Abrasion |

According to the test results, as shown in Table 2, abrasion was observed at a load of 300 N and 200 N, respectively, in comparative examples 1 and 2, which did not include formation of the hard carbon foundation film. In contrast, it was confirmed that examples 1 and 2, which included formation of the hard carbon foundation film, exhibited favorable wear resistance without observation of abrasion even at a load of 500 N. It should be noted that a circle ("○") in Table 2 indicates that abrasion was not observed.

[Friction and Wear Test Results]

FIGS. 8A to 8C are images showing the results of testing using the SRV tester illustrated in FIG. 7. FIG. 8A is an image of when the piston ring of example 1 was tested at a load of 300 N for 10 minutes, and FIG. 8B is an image of when the piston ring of example 2 was tested at a load of 500 N for 10 minutes. In either case, abrasion was not able to be confirmed. Further, FIG. 8C is an image of when the piston ring of comparative example 1 was tested at a load of 300 N for 10 minutes, and abrasion was observed.

Example 3

A CrN film having a thickness of 30 μm was formed on the piston ring base material 1 obtained in example 1 using an ion plating method. The surface roughness was adjusted by lapping and polishing, the same foundation film 2 (titanium film) as that in example 1 was then formed to a thickness of 0.08 μm using an ion plating method under the same conditions as those in example 1, and the same 0.2-μm thick hard carbon foundation film 3 as that in example 1 was formed on the foundation film 2 under the same conditions as those in example 1. The hard carbon film 4 made of a single-layered film having a thickness of 0.8 μm was formed on the hard carbon foundation film 3. While the film-forming conditions of this hard carbon film 4 were the same as those in example 1, the thickness was adjusted by the film-forming time.

Example 4

A CrN film having a thickness of 30 μm was formed on the piston ring base material 1 obtained in example 1 using an ion plating method. The surface roughness was adjusted by lapping and polishing, the same foundation film 2 (titanium film) as that in example 1 was then formed to a thickness of 0.08 μm using an ion plating method under the same conditions as those in example 1, and the same 0.2-μm thick hard carbon foundation film 3 as that in example 1 was formed on the foundation film 2 under the same conditions as those in example 1. The hard carbon film 4 made of a nano-laminated film having a thickness of 0.8 μm was formed on the hard carbon foundation film 3. The nano-laminated film at this time was formed by setting the arc current to 120 A and alternately applying a predetermined low bias voltage and a predetermined high bias voltage in pulses. Specifically, the film was formed by applying in pulses conditions A: a low bias voltage of −140 V and a high bias voltage of −220 V for one second each (total: 1000 seconds), and conditions B: a low bias voltage of −150 V and a high bias voltage of −1800 V for one second each (total: 350 second) as one cycle, in the order of A and B. It should be noted that, ultimately, conditions A were set for 1000 seconds total, and conditions B were set for 350 seconds total. The thickness of this hard carbon film 4 was adjusted by the repetition count of the cycle.

Example 5

In example 4, the piston ring was made in the same way as example 4 other than the thickness of the hard carbon film 4 was set to 5 μm. It should be noted the thickness of this hard carbon film 4 was adjusted by the repetition count of the cycle. This hard carbon film 4 was a nano-laminated film, and was analyzed in 10 locations at an equal interval in the thickness direction of each film. The results are shown in Table 3. Based on the results in Table 3, the average $sp^2$ component ratio was 45.6%. The range of the average value of the $sp^2$ component ratios, as already described, is preferably within a range of 40% to 80%, and the average value according to the results being within a range of 40% to 50% is even more preferred.

As illustrated in FIG. 10, given 1 as the wear result of the fixed piece of comparative example 2, which did not include formation of the hard carbon foundation film, examples 1 to 5, which included formation of the hard carbon foundation film, exhibited wear of the fixed piece equivalent to ½ or less, and was confirmed to have favorable wear resistance.

DESCRIPTIONS OF REFERENCE NUMERALS

1 Piston ring base material
2 Foundation film
3 Hard carbon foundation film
4 Hard carbon film (Single-layered or nano-laminated film)
5 Topmost surface film (Nano-laminated film)
10, 10A, 10B Piston ring
11 Sliding surface (External peripheral sliding surface)
12 Top surface
13 Bottom surface
14 Internal peripheral surface
20 Sliding side test piece (Pin-type test piece)
21 Opposing side test piece (Disk type test piece)
30 Rotational plane sliding friction tester
31 Measurement sample
32 Opposing material
33 Lubricant
P Load

TABLE 3

|  | Analysis Point | Peak Surface Area (Near 285 eV) | Peak Surface Area (280-310 eV) | Area Ratio | $sp^2$ Component Ratio |
| --- | --- | --- | --- | --- | --- |
| Hard Carbon Film | 1 | 1.22 | 23.40 | 0.052 | 50 |
|  | 2 | 1.02 | 23.01 | 0.044 | 52 |
|  | 3 | 1.17 | 22.68 | 0.052 | 49 |
|  | 4 | 1.06 | 22.60 | 0.047 | 44 |
|  | 5 | 1.13 | 22.66 | 0.050 | 47 |
|  | 6 | 1.06 | 22.74 | 0.047 | 44 |
|  | 7 | 1.11 | 22.79 | 0.048 | 46 |
|  | 8 | 1.03 | 22.86 | 0.045 | 42 |
|  | 9 | 1.09 | 22.77 | 0.048 | 45 |
|  | 10 | 0.90 | 22.45 | 0.040 | 37 |

[Wear Test]

A wear test was conducted using an Amsler-type wear tester 30 illustrated in FIG. 9. The samples obtained in examples 1 to 5 and comparative examples 1 to 3 were each made into rectangular parallelepiped shaped measurement samples 31 (7 mm×8 mm×5 mm) corresponding to the piston ring and, using a toroidal object (outside diameter: 40 mm, inside diameter: 16 mm, thickness: 10 mm) for the opposing material (rotating piece) 32, each measurement sample 31 and the opposing material 32 were brought into contact, a load P was applied, the test conditions were set as described below, and the wear ratio of the fixed piece was measured. It should be noted that the lower half of the opposing material 32 was soaked in a lubricant 33. The results are shown in FIG. 10.

Tester: Amsler-type wear tester
Lubricant: 0W-20
Oil temperature: 80° C.
Circumferential speed: 1.0 m/s
Load: 196 N
Test time: 7 hours
Opposing material: Boron cast iron
Foundation film: 0.3 μm Ti layer formed using ion plating method

What is claimed is:

1. A manufacturing method for a piston ring having an amount of macroparticles appearing on a surface of a hard carbon film within a range of 0.1% to 10% inclusive by area ratio, the method comprising:
    a hard carbon foundation film forming step of forming a hard carbon foundation film formed by a physical vapor disposition method on at least an external peripheral sliding surface of a piston ring base material under lower speed film-forming conditions than film-forming conditions in a hard carbon film forming step described below; and
    a hard carbon film forming step of forming a hard carbon film formed by the same physical vapor deposition method as described above on the hard carbon foundation film under film-forming conditions that result in an $sp^2$ component ratio within a range of 40% to 80% inclusive as measured by a TEM-EELS spectrum, and a hydrogen content within a range of 0.1 at. % to 5 at. % inclusive, wherein
    an arc current value of low-speed film-forming conditions in the hard carbon foundation film forming step is 80% or less of the arc current value in the hard carbon film forming step.

2. The manufacturing method for a piston ring according to claim 1,
further comprising a foundation film forming step of forming titanium or chromium on a piston ring base material before the hard carbon foundation film forming step.

3. The manufacturing method for a piston ring according to claim 1, wherein
a hard carbon film formed in the hard carbon film forming step is a single-layered film formed under certain film-forming condition or a nano-laminated film formed under a plurality of film-forming conditions.

4. The manufacturing method for a piston ring according to claim 3, wherein
the nano-laminated film is formed by alternately applying at least two different bias voltages.

5. A manufacturing method for a piston ring having an amount of macroparticles appearing on a surface of a hard carbon film within a range of 0.1% to 10% inclusive by area ratio, the method comprising:
a hard carbon foundation film forming step of forming a hard carbon foundation film formed by a physical vapor disposition method on at least an external peripheral sliding surface of a piston ring base material under lower speed film-forming conditions than film-forming conditions in a hard carbon film forming step described below;
a hard carbon film forming step of forming a hard carbon film formed by the same physical vapor deposition method as described above on the hard carbon foundation film under film-forming conditions that result in an $sp^2$ component ratio within a range of 40% to 80% inclusive as measured by a TEM-EELS spectrum, and a hydrogen content within a range of 0.1 at. % to 5 at. % inclusive; and
a foundation film forming step of forming titanium or chromium on a piston ring base material before the hard carbon foundation film forming step, wherein
a hard carbon film formed in the hard carbon film forming step is a single-layered film formed under certain film-forming condition or a nano-laminated film formed under a plurality of film-forming conditions.

* * * * *